United States Patent [19]

Orcutt

[11] Patent Number: 4,712,129
[45] Date of Patent: Dec. 8, 1987

[54] INTEGRATED CIRCUIT DEVICE WITH TEXTURED BAR COVER

[75] Inventor: John W. Orcutt, Garland, Tex.

[73] Assignee: Texas Instruments Incorporated, Dallas, Tex.

[21] Appl. No.: 781,175

[22] Filed: Sep. 30, 1985

Related U.S. Application Data

[63] Continuation of Ser. No. 560,765, Dec. 12, 1983, abandoned.

[51] Int. Cl.$^4$ .................... H01L 23/28; H01L 25/04; H01L 23/02
[52] U.S. Cl. ........................ 357/84; 357/72; 357/81
[58] Field of Search ............................ 357/81, 72, 84

[56] References Cited

U.S. PATENT DOCUMENTS 4,069,497 1/1978 Steidlitz .......................... 357/80
4,104,676 8/1978 Bednorz et al. .................. 357/72

FOREIGN PATENT DOCUMENTS 0040732 12/1970 Japan ............................. 357/81 B
0094760 7/1981 Japan ............................. 357/81
0084153 5/1982 Japan ............................. 357/72
0048950 3/1983 Japan ............................. 357/84
0111351 7/1983 Japan ............................. 357/84

Primary Examiner—Martin H. Edlow
Assistant Examiner—Robert P. Limanek
Attorney, Agent, or Firm—Frederick J. Telecky, Jr.; James T. Comfort; Melvin Sharp

[57] ABSTRACT

A semiconductor integrated circuit device includes a rigid planar member or cover affixed to and overlying at least a portion of the upper surface of a semiconductor integrated circuit bar. The upper surface of the planar member is textured to lock the member to the encapsulating medium, and has a thermal coefficient of expansion similar to that of the integrated circuit bar. According to another aspect of the invention the planar member is formed of a material having a low alpha particle emission.

16 Claims, 5 Drawing Figures

3
INTEGRATED CIRCUIT DEVICE WITH TEXTURED BAR COVER

This is a continuation of application Ser. No. 560,765, filed Dec. 12, 1983, now abandoned.

BACKGROUND OF THE INVENTION

The present invention relates generally to semiconductor integrated circuit (IC) devices, and more particularly to an IC device having a textured, rigid member overlying at least a portion of the active area of the IC.

As semiconductor IC bars increase in size, the packaging of the bars becomes more important in determining the integrity and reliability of the completed device. One problem associated with large bars, particularly those encapsulated in plastic, is the thermal expansion stress exerted on the bar by the package. The plastic and the bar and bar pad expand and contract at different rates, which can cause a shear force at the periphery of the bar sufficient to crack or otherwise damage ball bonds, or to disturb metal lines on the bar surface. This is particularly evident during temperature cycling of the completed device.

Another problem encountered in semiconductor IC devices, for example high density memory devices, is that of alpha particle radiation. It is known that alpha particles penetrating a memory device can alter the charge stored in the memory cells and thus destroy the data stored in the device. One method of preventing this is to include an alpha shield overlying the active area of the device. One such shield is a polyimide tape affixed by an adhesive to the surface of the IC. Alternatively, a polyimide film may be formed on the surface of the IC and cured in situ prior to encapsulation. An important disadvantage of polyimide, however, is its tendency to absorb moisture. Thus, particular care must be taken to form the film or to affix the tape in a moisture-free ambient.

SUMMARY OF THE INVENTION

Accordingly, the present invention overcomes many of the aformentioned disadvantages by providing a semiconductor device including a textured, rigid planar member overlying at least a portion of the surface of the device.

In one embodiment of the invention the planar member has a thermal coefficient of expansion similar to that of the IC bar. In this manner, the shear stress is more evenly distributed over the surface of the bar. If the IC bar is silicon, the planar member may be formed, for example, of silicon or Alloy 42, which have similar coefficients of thermal expansion. The planar member is affixed to the surface of the bar by an adhesive, and the exposed surface of the planar member is textured or otherwise made irregular, for example, by forming grooves therein or by chemical etching. When the device is encapsulated in plastic this texturing locks the planar member to the plastic and contains or controls the thermal shear stress.

In another embodiment of the invention, the planar member covers the entire active area of the IC device and forms an effective alpha shield.

BRIEF DESCRIPTION OF THE DRAWINGS

Other objects and many of the advantages of the present invention will become apparent, and the invention will be better understood by reference to the following detailed description with the accompanying drawings, wherein.

DETAILED DESCRIPTION OF THE PREFERRED EMBODIMENT

Figure 1:
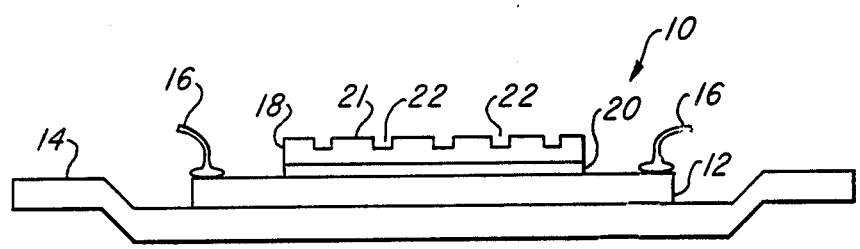
FIG. 1 is a cross-sectional view of a semiconductor integrated circuit device including the textured bar cover of the present invention.
Figure 2:
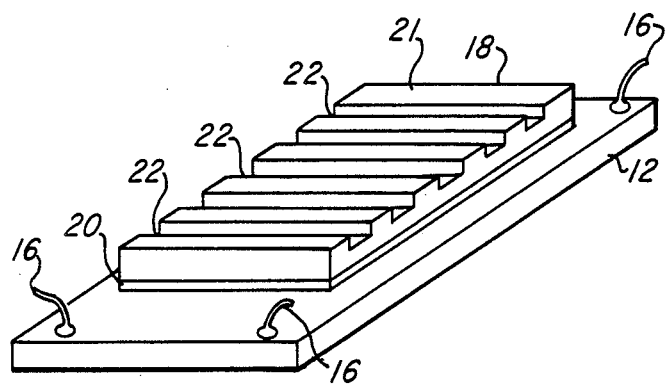
FIG. 2 is a diagrammatic view of the device of FIG. 1, showing the textured bar cover in greater detail.

Referring now to the drawings, there is shown in FIG. 1 a completed integrated circuit device 10 prior to encapsulation. Device 10 includes a semiconductor bar 12 having active devices formed in the upper surface thereof, affixed to a bar pad 14. Bar pad 14 is typically conductive and is attached to a lead frame (not shown) along with a plurality of other IC devices 10. A plurality of wires 16 are bonded to bond pads on the surface of bar 12 to provide connections from the circuits on bar 12 to the lead frame conductors (not shown). According to one embodiment of the present invention, a rigid planar member 18 is affixed to the upper surface of bar 12, for example, be means of an adhesive film 20. Planar member 18 forms a cover for bar 12 and overlies at least a portion of the active area thereof, i.e., the area in which devices are formed, bounded by the pads to which wires 16 are bonded. Prior to being affixed to bar 12, the upper surface 21 of planar member 18 is textured, for example, by a plurality of grooves 22 formed therein. Planar member 18 may advantageously be approximately the same thickness as bar 12, that is, on the order of about 10 mils, with the grooves extending about 1-3 mils into member 18. The grooves 22 may be formed by sawing or other known means in a pattern as shown in FIG. 2. Alternatively, a second set of grooves (not shown) may be formed perpendicular to grooves 22 to create a "waffled" effect.

Figure 3:
FIG. 3 is a cross-sectional view of a bar cover illustrating an alternate means of texturing.

An alternate means of texturing the upper surface 21 of planar member 18 is by chemical or plasma etching which produces a roughened or pebbled effect as shown in FIG. 3. Any conventional etchant may be used, for example, hydrofluoric acid when member 18 is formed of silicon.

Figure 4:
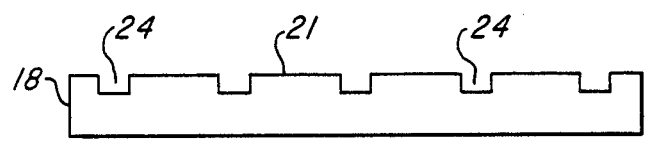
FIG. 4 is a cross-sectional view of a bar cover according to the present invention illustrating yet another means of texturing.
Figure 5:
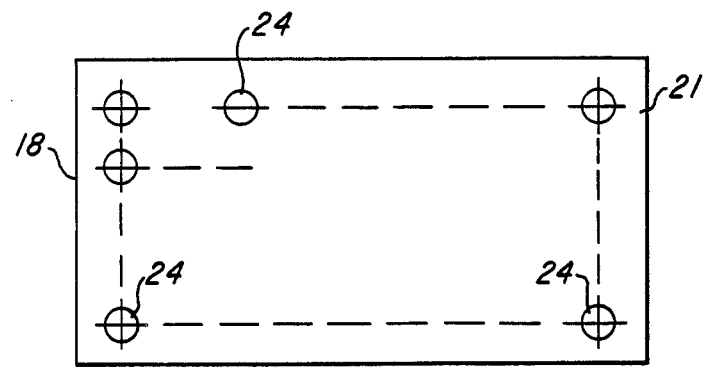
FIG. 5 is a top plan view of the bar cover of FIG. 4.

Yet another embodiment of the present invention is shown in FIGS. 4 and 5 wherein a plurality of cavities 24 are formed in the upper surface 21 of planar member 18. The cavities 24 may be formed in any desired pattern by conventional masking and etching techniques.

The textured surface 21 of member 18 provides a means for mechanically locking the upper surface of the bar 12 to the encapsulating medium, for example, plastic, and controlling the shear stresses caused by differential thermal expansion or contraction of the plastic and the bar 12. It is preferable that planar member 18 be formed of a material having a coefficient of thermal expansion similar to that of the bar 12. For example, when bar 12 is silicon, planar member 18 may be formed of silicon or of Alloy 42, which is a well known compound whose primary constituents are nickel and iron.

In another embodiment of the invention, planar member 18 covers the entire active area of bar 12 bounded by, but not including, the areas to which wires 16 are connected. In this manner, member 18 imparts structural integrity to the IC and additionally provides protection against alpha particle radiation. Silicon and Alloy 42 may also be advantageously used as alpha particle shields.

The present invention thus provides an improved IC packaging structure that overcomes the undesirable effects of thermal expansion and provides an effective alpha particle shield. Further, the present structure may readily be formed by conventional semiconductor processing techniques.

Other embodiments and modifications of the present invention will readily come to those skilled in the art having the benefit of the foregoing description and drawings. It is therefore to be understood that such modifications and embodiments are intended to fall within the spirit and scope of the appended claims.

What is claimed is:

1. An integrated circuit device comprising:
   support means;
   a semiconductor bar affixed to said support means;
   adhesive means for providing an adhesive layer; and
   a rigid planar member having a smooth surface, and a textured surface for locking to an encapsulating medium with the smooth surface being affixed to a surface of said bar opposite said support means by the adhesive layer, the adhesive layer being dispersed between the smooth surface and the surface of said bar.

2. The integrated circuit device of claim 1 wherein said rigid planar member has a temperature coefficient of expansion similar to that of said semiconductor bar.

3. The integrated circuit device of claim 2 wherein said textured surface of said planar member includes a plurality of grooves formed therein.

4. The integrated circuit device of claim 2 wherein said textured surface of said planar member is pebbled.

5. The integrated circuit device of claim 2 wherein said textured surface of said planar member includes a plurality of spaced apart cavities formed therein.

6. The integrated circuit device of claim 1 wherein said rigid planar member is formed of silicon.

7. An integrated circuit device comprising:
   support means;
   a semiconductor bar affixed to said support means;
   adhesive means for providing an adhesive layer;
   a rigid planar member having a smooth surface, and a textured surface for locking to an encapsulating medium with the smooth surface being affixed to a surface of said bar opposite said support means by the adhesive layer and wherein said planar member covers the entire area of said semiconductor bar having active devices formed therein.

8. The integrated circuit device of claim 7 wherein said rigid planar member is formed of silicon.

9. The integrated circuit device of claim 8 wherein said textured surface of said planar member includes a plurality of grooves formed therein.

10. The integrated circuit device of claim 8 wherein said textured surface of said planar member is pebbled.

11. The integrated circuit device of claim 8 wherein said textured surface of said planar member includes a plurality of spaced apart cavities formed therein.

12. An integrated circuit device comprising:
    support means;
    a semiconductor bar affixed to said support means;
    adhesive means for providing an adhesive layer;
    a rigid planar member having a smooth surface, and a textured surface for locking to an encapsulating medium with the smooth surface being affixed to a surface of said bar opposite said support means by the adhesive layer, the adhesive layer being dispersed between the smooth surface and the surface of said bar; and
    a plastic enclosure means for encapsulating said semiconductor bar, said support means, and said rigid planar member.

13. The integrated circuit device of claim 12 wherein said textured surface of said rigid planar member includes a plurality of grooves formed therein.

14. The integrated circuit device of claim 12 wherein said textured surface of said rigid planar member includes a plurality of spaced apart cavities formed therein.

15. The integrated circuit device of claim 12 wherein said textured surface of said rigid planar member is pebbled.

16. The integrated circuit device of claim 12 wherein said rigid planar member is formed of silicon.

* * * * *